(12) United States Patent
Eun

(10) Patent No.: US 7,736,972 B2
(45) Date of Patent: Jun. 15, 2010

(54) METHOD FOR FORMING STORAGE ELECTRODE OF SEMICONDUCTOR MEMORY DEVICE

(75) Inventor: Byung Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 56 days.

(21) Appl. No.: 12/049,024

(22) Filed: Mar. 14, 2008

(65) Prior Publication Data

US 2008/0318407 A1 Dec. 25, 2008

(30) Foreign Application Priority Data

Jun. 22, 2007 (KR) .................. 10-2007-0061416

(51) Int. Cl.
*H01L 21/8242* (2006.01)

(52) U.S. Cl. .................. 438/255; 438/239; 438/253; 438/254; 438/381; 438/398; 257/E21.214

(58) Field of Classification Search .................. 438/239, 438/253, 254, 255, 256, 381, 398; 257/E21.214
See application file for complete search history.

(56) References Cited

U.S. PATENT DOCUMENTS

| | | | |
|---|---|---|---|
| 2002/0022320 A1* | 2/2002 | DeBoer et al. | 438/255 |
| 2002/0160559 A1 | 10/2002 | Lee et al. | |
| 2003/0008454 A1 | 1/2003 | Kim | |
| 2004/0206996 A1* | 10/2004 | Lee et al. | 257/296 |
| 2005/0112865 A1* | 5/2005 | Lee et al. | 438/622 |
| 2006/0145229 A1* | 7/2006 | Kang | 257/301 |
| 2006/0160337 A1* | 7/2006 | Kim et al. | 438/507 |
| 2008/0017908 A1* | 1/2008 | Cho et al. | 257/311 |
| 2008/0044971 A1* | 2/2008 | Kang et al. | 438/253 |
| 2008/0277708 A1* | 11/2008 | Mun | 257/296 |
| 2008/0283892 A1* | 11/2008 | Kang | 257/301 |

FOREIGN PATENT DOCUMENTS

| | | |
|---|---|---|
| KR | 10-1999-0042454 | 6/1999 |
| KR | 10-2000-0004331 A | 1/2000 |
| KR | 10-2005-0116665 | 12/2005 |
| KR | 10-2006-0072963 | 6/2006 |

* cited by examiner

*Primary Examiner*—George Fourson
*Assistant Examiner*—John M Parker
(74) *Attorney, Agent, or Firm*—Marshall, Gerstein & Borun LLP

(57) ABSTRACT

In order to form a storage electrode of a semiconductor memory device, an interlayer dielectric layer is formed on a semiconductor substrate having a bit line thereon. A contact hole exposing the semiconductor substrate is formed by patterning the interlayer dielectric layer. A polysilicon layer is etched to a predetermined thickness using polysilicon etching gas after the polysilicon layer is deposited. An over-etch process is performed relative to the polysilicon layer, and then a storage node contact having a planarized surface is formed in the contact hole by performing an etching process for planarizing the surface of the polysilicon layer. A mold insulating layer is formed on the resultant structure, in which the mold insulating layer exposes an area where the storage node contact is formed. A storage electrode coupled to the storage node contact is formed.

17 Claims, 3 Drawing Sheets

METHOD FOR FORMING STORAGE ELECTRODE OF SEMICONDUCTOR MEMORY DEVICE

CROSS-REFERENCE TO RELATED APPLICATION

Priority to Korean application number 10-2007-0061416, filed on Jun. 22, 2007, which is incorporated by reference in its entirety, is claimed.

BACKGROUND OF THE INVENTION

The invention relates to a method of manufacturing a semiconductor device and, more particularly, to a method of forming a storage electrode of a semiconductor memory device.

As the design rules of semiconductor memory devices continue to decrease, it becomes more difficult to form the memory devices in a limited area. For example, in the case of a DRAM, it has become more difficult to form a capacitor having sufficient capacitance in a limited area.

In a conventional semiconductor memory device, because photolithography and etching processes have been performed with a sufficient margin, a problem does not occur during the patterning process caused by a step difference or a surface roughness. However, as the design rules decrease, the process margin has also been reduced. As a result, the patterning problem caused by the step difference or the surface roughness is newly arising, and the number of process steps is significantly increased. Accordingly, reducing the number of processes and the manufacturing cost has become an important factor to determine the competitiveness of a device in the future.

Meanwhile, a storage electrode of a capacitor is electrically connected to a semiconductor substrate through a storage node contact. In order to form the storage node contact, an interlayer dielectric layer is formed in a state in which a word line and a bit line have been formed, and then a contact hole is formed to expose a predetermined area of the semiconductor substrate or a contact plug coupled to the semiconductor substrate. Subsequently, a conductive layer is deposited on an entire surface of the contact hole until the conductive layer has a predetermined thickness sufficient to fill the contact hole. At this time, the conductive layer generally includes a doped polysilicon layer. After that, the storage node contacts are separated from each other through a conventional etch back process using polysilicon etching gas, or a chemical mechanical polishing (CMP) process.

However, when performing the CMP process to separate the storage node contacts from each other after etching the polysilicon layer by using the polysilicon etching gas, a dishing phenomenon is observed and a severe wave-shaped topology is formed due to an over etch or an over CMP. Such a defective topology is transferred onto a mold insulating layer when depositing the mold insulating layer to form the storage electrode in the subsequent process, so that the mold insulating layer also has the defective topology. As a result, a pattern is improperly transferred and a pattern defect or a pattern deformation is incurred during the photo process for patterning the mold insulating layer.

After depositing the mold insulating layer, a planarization process of the mold insulating layer must be separately performed in order to prevent such a phenomenon; thus, this phenomenon causes a time loss and an economic loss. In addition, an over etch target must be set when performing the storage node etching process due to the defective topology, so the process margin may be significantly reduced in the photo and etching processes.

SUMMARY OF THE INVENTION

The invention is directed to a method of forming a storage electrode of a semiconductor memory device capable of simplifying processes and facilitating subsequent processes by forming a storage node contact having a planar surface.

In one embodiment, a method of forming a storage electrode of a semiconductor memory device includes: forming an interlayer dielectric layer over a semiconductor substrate having a bit line over the semiconductor substrate; patterning the interlayer dielectric layer to form a contact hole exposing the semiconductor substrate; forming a polysilicon layer on the resulting surface and within the contact hole; forming a storage node contact having a planarized surface in the contact hole by sequentially performing a first etching process for etching the polysilicon layer to a predetermined thickness, a second etching process for over-etching the polysilicon layer, and a third etching process for planarizing a surface of the polysilicon layer; forming a mold insulating layer which exposes an area where the storage node contact is formed; and forming a storage electrode coupled to the storage node contact.

The forming of the interlayer dielectric layer preferably includes: depositing an insulating layer over the semiconductor substrate; and etching the insulating layer such that a portion of the insulating layer having a thickness of about 400 Å to 700 Å remains on the bit line.

The interlayer dielectric layer preferably includes a high density plasma (HDP) oxide layer or a spin-on dielectric (SOD) layer.

The etching of the insulating layer preferably includes a chemical mechanical polishing (CMP) process.

In an embodiment, the method further comprises: forming gate stacks over the semiconductor substrate; and forming a contact plug in contact with the semiconductor substrate at a region between the gate stacks, before the bit line is formed.

The first etching process preferably is applied to the polysilicon layer by using a chlorine ($Cl_2$) gas as an etching gas.

The first etching process preferably is performed under a pressure of about 5 mTorr for about 56 seconds.

The second etching process preferably is performed by using hexafluoroethane ($C_2F_6$) gas as an etching gas.

The third etching process preferably is performed by using an etching gas that does not react with the polysilicon layer or an oxide layer.

The third etching process preferably uses a mixture gas of helium (He) and oxygen ($O_2$) as the etching gas.

The third etching process preferably is performed by adding an argon (Ar) gas to a mixture gas of helium (He) and oxygen ($O_2$).

The third etching process preferably is performed under a pressure of about 7 mTorr for about 100 seconds.

In an embodiment, the method further includes removing a natural oxide layer from the polysilicon layer before the first etching process is performed.

The step of removing the natural oxide layer is preferably performed by using hexafluoroethane ($C_2F_6$) gas as an etching gas.

The storage electrode preferably includes the polysilicon layer and a metal layer.

DETAILED DESCRIPTION OF THE PREFERRED EMBODIMENT

The invention provides a method of forming a storage electrode, and is capable of effectively manufacturing a highly integrated memory device by forming a storage node contact having a good topology.

Figure 1:
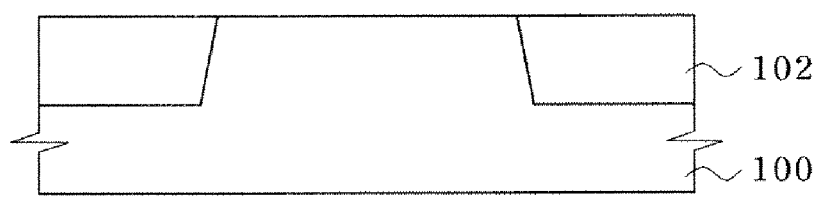
FIGS. 1 through 5 illustrate a method of forming a storage electrode of a semiconductor device according to the invention.

Referring to FIG. 1, an isolation layer 102 is formed to define an active area on a semiconductor substrate 100 such as silicon (Si). The isolation layer 102 can be formed through a method generally known in the art, such as a shallow trench isolation (STI) method. In more detail, a pad oxide layer (not shown) and a nitride layer (not shown) are formed on the semiconductor substrate 100, and then the nitride layer and the pad oxide layer are patterned through a photolithography process in order to expose an isolation area. A trench can be formed in the isolation area through etching the exposed area of the semiconductor substrate 100 by a predetermined depth suitable for separating devices from each other by using the patterned nitride layer and pad oxide layer as masks. The resultant trench is filled with an insulating material such as an oxide layer, and then the surface thereof is planarized, thereby forming the isolation layer 102. In order to compensate for the damage incurred during the etching process of forming the trench, an inner wall oxide layer can be formed on an inner wall of the trench before filling the trench with the insulating material.

Figure 2:
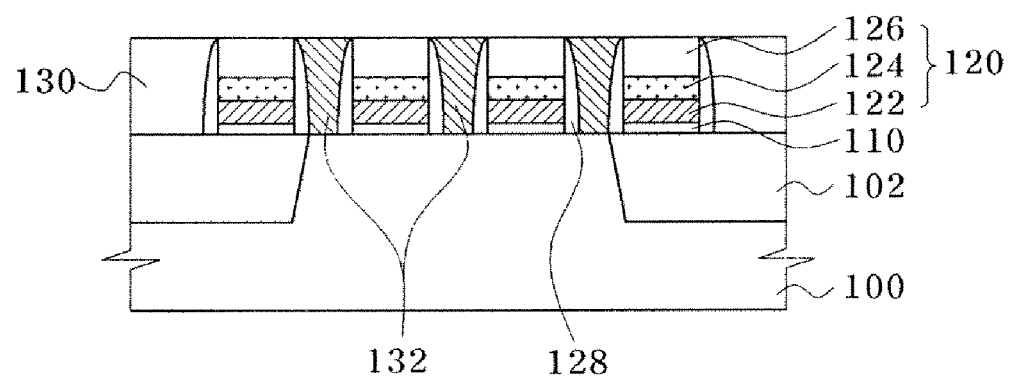

Referring to FIG. 2, a gate stack 120 and a contact plug 132 are formed on the semiconductor substrate 100 having the isolation layer 102 thereon. In detail, a gate insulating layer 110 is formed on the semiconductor substrate 100 having the isolation layer 102 thereon by forming, for instance, an oxide layer. Next, a polysilicon layer 122 doped with impurities, tungsten silicide (WSi) 124 and a nitride layer 126 are sequentially deposited. The nitride layer 126 serves as a hard mask to protect the gate conductive layers 122 and 124 during the etching process of forming a gate electrode.

After that, the polysilicon layer 122, the tungsten silicide 124 and the nitride layer 126 are patterned through a photolithography process, thereby forming the gate stack 120. A spacer 128 including an insulating layer can be formed at a sidewall of the gate stack 120. An interlayer dielectric layer 130 can be formed on the semiconductor substrate 100 having the gate stack 120 thereon by depositing, for instance, an oxide layer so as to separate the gate stacks 120 from each other. Next, the contact plug 132, which is in contact with the semiconductor substrate 100 at a region between the gate stacks 120, is formed through a method generally known in the art, such as a self-align contact process.

Figure 3:
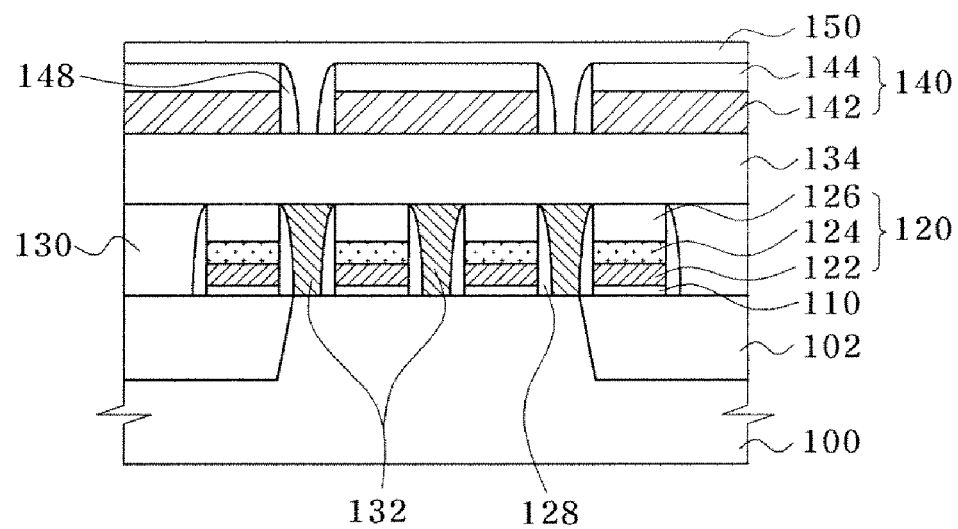

Referring to FIG. 3, an interlayer dielectric layer 134 is formed on the semiconductor substrate 100 having the contact plug 132 thereon by depositing, for instance, an oxide layer. For example, a tungsten layer 142 and a nitride layer 144 are sequentially deposited on the interlayer dielectric layer 134, and then the tungsten layer 142 and the nitride layer 144 are patterned through a photolithography process, thereby forming a bit line stack 140. The nitride layer 144 serves as a hard mask to protect the bit line during the etching process. Although not shown, the bit line stack 140 is coupled to the semiconductor substrate 100 through a part of the contact plugs 132. A spacer 148 including an insulating layer can be formed at a sidewall of the bit line stack 140.

Subsequently, in order to separate the bit line stacks 140 from each other, an interlayer dielectric layer 150 is formed by depositing an insulating layer, such as a high density plasma (HDP) oxide layer or a spin-on dielectric (SOD) layer, on the resultant structure having the bit line stack 140 at a predetermined thickness. Next, a planarization process such as a CMP is applied to the interlayer dielectric layer 150 to planarize the surface thereof. As shown, an etching amount is adjusted so that the interlayer dielectric layer 150 having a thickness of about 500 Å, preferably about 400 Å to 700 Å, remains on a top of the bit line stack 140. Because the interlayer dielectric layer 150 having a predetermined thickness remains on the top of the bit line stack 140, the bit line can be prevented from being recessed during a subsequent etching process to planarize a contact plug.

Figure 4:
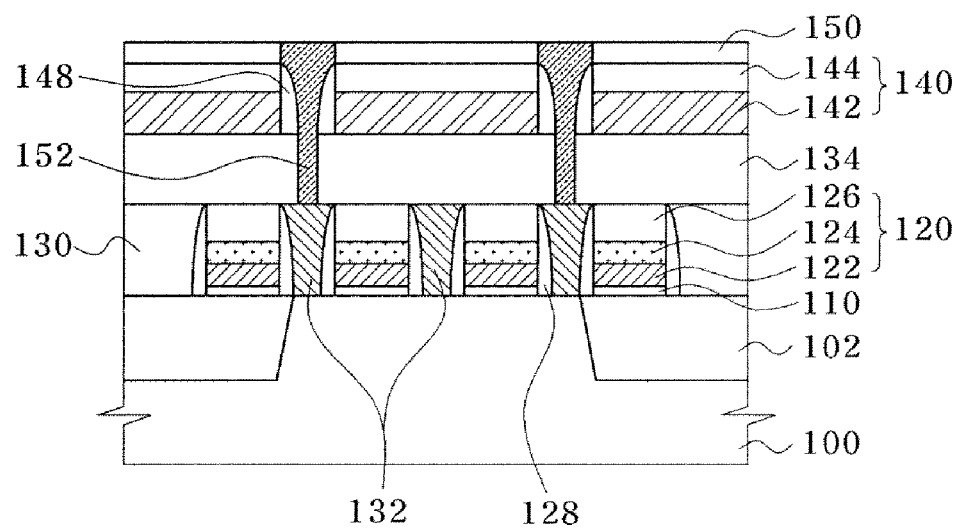

Referring to FIG. 4, a photoresist pattern (not shown) is formed on the interlayer dielectric layer 150, in which the photoresist pattern defines an area where a storage node contact is formed. The interlayer dielectric layers 150 and 134 are etched by using the photoresist pattern as a mask so as to form a contact hole where the storage node contact that couples a storage electrode with the contact plug 132 is subsequently formed. Thus, the contact plug 132 is exposed at the area where the storage node contact, which couples the storage electrode with the semiconductor substrate 100, is formed later.

After that, a conductive layer for forming the storage node contact is formed by depositing, for instance, a polysilicon layer having a predetermined thickness and being doped with impurities on the entire surface of the semiconductor substrate 100 having the contact hole. Next, a storage node contact 152 is formed by etching back the deposited polysilicon layer. The etching back process is preferably performed according to the following conditions and procedures.

First, the etching process is performed for 10 seconds by using a hexafluorocarbon (e.g., hexaflouroethane, $C_2F_6$) gas having a flow rate of about 80 sccm under the pressure of about 5 mTorr, thereby removing a natural oxide layer from the polysilicon layer. At this time, a power of 300 W is set to an upper portion of the process chamber and a power of 110 W is set to a lower portion of the process chamber.

Subsequently, the polysilicon layer is etched to a predetermined thickness for about 56 seconds by using a chlorine ($Cl_2$) gas having the flow rate of about 70 sccm under the pressure of about 5 mTorr. At this time, the process chamber has the upper power of 380 W and the lower power of 45 W.

After that, an over-etch process is applied for 30 seconds to the polysilicon layer by using the hexafluorocarbon ($C_2F_6$) gas having the flow rate of about 80 sccm under the pressure of about 5 mTorr. At this time, a power of 300 W is set to an upper portion of the process chamber and a power of 110 W is set to a lower portion of the process chamber.

Finally, a process of planarizing the surface of the polysilicon layer is performed. Here, the gas that rarely reacts with the polysilicon layer and the oxide layer is used. For example, helium (He) gas and oxygen ($O_2$) gas can be used as a base, and argon (Ar) gas may be added to improve the planarization characteristics. In a preferred embodiment according to the invention, the helium (He) gas with the flow rate of about 300 sccm, the oxygen ($O_2$) gas with the flow rate of about 500 sccm and the argon (Ar) gas with the flow rate of about 100 sccm may be applied as the etching gas. Preferably, the process chamber has the pressure of about 7 mTorr, a power of about 4000 W is set to an upper portion of the process chamber, a power of about 700 W is set to a lower portion of the process chamber, and the process time is about 100 seconds.

The above processes to form the storage node contact 152 can be performed in-situ in one chamber. In addition, the conditions of each process, such as power, pressure, process time and flow rate of gas, can be appropriately changed according to the specific equipment used. However, the planarization process is performed by using the etching gas that does not react with the polysilicon layer and the oxide layer, such that the surface topology of the storage node contact 152 is fairly formed. If such an etching process and a planarization process are applied to the polysilicon layer, the storage node contact 152 having a good surface topology can be obtained. Accordingly, a planarization process applied to a mold insulating layer to form an electrode can be omitted in the subsequent process.

Figure 5:
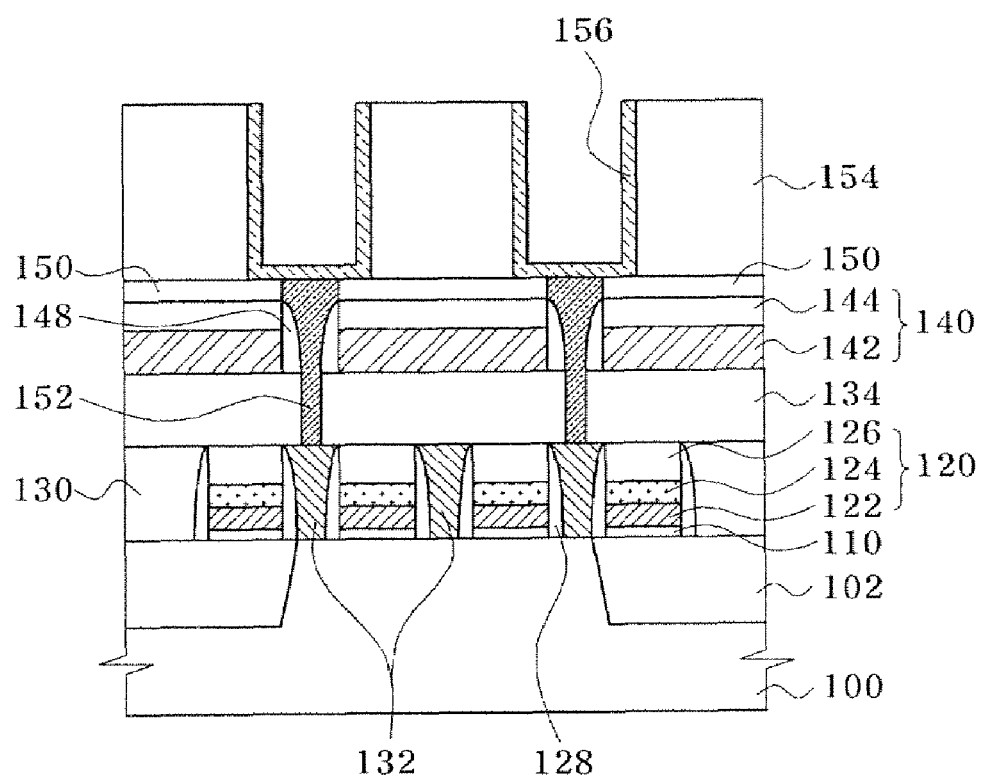

Referring to FIG. 5, a mold insulating layer 154 is formed on the resultant semiconductor substrate having the storage node contact 152 thereon in order to form a storage electrode. The mold insulating layer 154 can be formed by laminating, for instance, phospho-silicate glass (PSG) and plasma enhanced tetra-ethyl ortho-silicate (PETEOS). Because the height of the storage electrode is determined according to the thickness of the mold insulating layer 154, the thickness of the mold insulating layer 154 is preferably adjusted by taking an appropriate height of the storage electrode into consideration to obtain a desired capacitance.

Afterwards, the mold insulating layer 154 is patterned by using a mask for the storage electrode. At this time, an area including the storage node contact 152 is exposed. Next, a conductive layer for the storage electrode is deposited on the resultant structure including the patterned mold insulating layer 154. Then, the deposited conductive layer is patterned to form a storage electrode 156 defined in a cell unit. The conductive layer preferably includes a polysilicon layer. Otherwise, when forming a capacitor having a metal electrode, the conductive layer may include a metal layer such as a titanium nitride (TiN) layer.

Subsequently, although not shown, a dielectric layer and a conductive layer are deposited on the storage electrode 156, and then the resultant structure is patterned to form a dielectric layer (not shown) of a capacitor and a plate electrode (not shown) of a capacitor. If the mold insulating layer 154 is removed through a dip-out process before the dielectric layer is formed, inner and outer surfaces of the storage electrode may serve as an effective capacitor area, so that a cylindrical storage electrode capable of increasing capacitance can be obtained.

According to the method of forming a storage electrode of a semiconductor memory device of the invention, when the etch back process and the planarization process are performed after the polysilicon layer is deposited in order to form the storage node contact, the storage node contact having a good topology can be formed by changing the conditions of the processes. Accordingly, the planarization process applied to the mold insulating layer can be omitted in the subsequent process, so that the process can be simplified, and the margin of the photo and etching process can be improved due to the planarized surface.

Although preferred embodiments of the invention have been described above for illustrative purposes, those skilled in the art will appreciate that various modifications, additions and substitutions are possible, without departing from the scope and spirit of the invention as defined in the appended claims.

What is claimed is:

1. A method of forming a storage electrode of a semiconductor memory device, the method comprising the steps of:
   forming an interlayer dielectric layer over a semiconductor substrate where a bit line and a contact pad connected to the semiconductor substrate are formed on the semiconductor substrate;
   patterning the interlayer dielectric layer to form a contact hole exposing the contact pad;
   forming a polysilicon layer on the resulting surface and within the contact hole;
   forming a storage node contact having a planarized surface in the contact hole by sequentially performing a first etching process for etching the polysilicon layer to a predetermined thickness, a second etching process for over-etching the polysilicon layer, and a third etching process for planarizing a surface of the polysilicon layer, wherein the first, second and third etching processes are performed in-situ in one chamber;
   forming a mold insulating layer which exposes an area where the storage node contact is formed; and
   forming a storage electrode coupled to the storage node contact.

2. The method of claim 1, wherein the step of forming the interlayer dielectric layer comprises:
   depositing an insulating layer over the semiconductor substrate having the bit line and the contact pad thereon; and
   etching the insulating layer such that a portion of the insulating layer of a predetermined thickness remains on the bit line.

3. The method of claim 1, wherein the interlayer dielectric layer is selected from the group consisting of a high density plasma (HDP) oxide layer and a spin-on dielectric (SOD) layer.

4. The method of claim 2, wherein etching the insulating layer comprises performing a chemical mechanical polishing (CMP) process.

5. The method of claim 2, wherein the remaining portion of the insulating layer on the bit line has a thickness of about 400Å to about 700Å.

6. The method of claim 1, further comprising:
   forming gate stacks over the semiconductor substrate; and
   forming a contact plug in contact with the semiconductor substrate at a region between the gate stacks, before the bit line is formed.

7. The method of claim 1, wherein the first etching process comprises using chlorine ($Cl_2$) gas as an etching gas.

8. The method of claim 7, comprising performing the first etching process at a pressure of about 5 mTorr for about 56 seconds.

9. The method of claim 1, wherein the second etching process comprises using hexafluoroethane ($C_2F_6$) gas as an etching gas.

10. The method of claim 1, wherein the third etching process comprises using an etching gas that does not react with the polysilicon layer or an oxide layer.

11. The method of claim 10, wherein the etching gas of the third etching process comprises a mixture of helium (He) and oxygen ($O_2$).

12. The method of claim 10, wherein the etching gas of the third etching process comprises a mixture of argon (Ar), helium (He), and oxygen ($O_2$).

13. The method of claim 10, comprising performing the third etching process at a pressure of about 7 mTorr for about 100 seconds.

14. The method of claim 1, further comprising removing a natural oxide layer from the polysilicon layer before the first etching process is performed.

15. The method of claim 14, wherein the removing of the natural oxide layer comprises etching using hexafluoroethane ($C_2F_6$) gas as an etching gas.

16. The method of claim 1, wherein the storage electrode comprises a polysilicon layer and a metal layer.

17. The method of claim 1, further comprising removing the mold insulating layer after the storage electrode is formed.

* * * * *